United States Patent
Kosowsky et al.

(10) Patent No.: US 9,053,844 B2
(45) Date of Patent: Jun. 9, 2015

(54) GEOMETRIC CONFIGURATION OR ALIGNMENT OF PROTECTIVE MATERIAL IN A GAP STRUCTURE FOR ELECTRICAL DEVICES

(75) Inventors: Lex Kosowsky, San Jose, CA (US); Robert Fleming, San Jose, CA (US)

(73) Assignee: Littelfuse, Inc., Chicago, IL (US)

( * ) Notice: Subject to any disclaimer, the term of this patent is extended or adjusted under 35 U.S.C. 154(b) by 493 days.

(21) Appl. No.: 12/878,344

(22) Filed: Sep. 9, 2010

(65) Prior Publication Data
US 2011/0058291 A1 Mar. 10, 2011

Related U.S. Application Data

(60) Provisional application No. 61/241,000, filed on Sep. 9, 2009.

(51) Int. Cl.
| | |
|---|---|
| H02H 9/00 | (2006.01) |
| H01C 7/10 | (2006.01) |
| H02H 3/22 | (2006.01) |
| H01C 7/12 | (2006.01) |
| H05K 1/02 | (2006.01) |
| H05K 1/16 | (2006.01) |

(52) U.S. Cl.
CPC .. *H01C 7/10* (2013.01); *H01C 7/12* (2013.01); *H05K 1/0257* (2013.01); *H05K 1/0259* (2013.01); *H05K 1/167* (2013.01); *H05K 2201/0738* (2013.01)

(58) Field of Classification Search
CPC ............ H01L 27/0266; H01L 27/0251; H01L 27/0255; H01L 27/0262; H02H 9/046; H01C 7/10; H05K 1/026; H05K 1/057; H05K 1/0257; H05K 2201/0738
USPC ............ 361/56, 111, 117, 118, 120, 126, 127
See application file for complete search history.

(56) References Cited

U.S. PATENT DOCUMENTS

| | | | | |
|---|---|---|---|---|
| 2,913,626 | A | * | 11/1959 | Bislin .............................. 315/36 |
| 3,347,724 | A | | 10/1967 | Schneble, Jr. et al. |
| 3,356,893 | A | * | 12/1967 | Lafferty .................... 315/111.01 |

(Continued)

FOREIGN PATENT DOCUMENTS

| | | |
|---|---|---|
| CH | 663491 A5 | 12/1987 |
| DE | 3040784 A1 | 5/1982 |

(Continued)

OTHER PUBLICATIONS

U.S. Appl. No. 11/562,222, filed Nov. 21, 2006, Kosowsky.

(Continued)

*Primary Examiner* — Jared Fureman
*Assistant Examiner* — Nicholas Ieva
(74) *Attorney, Agent, or Firm* — Kacvinsky Daisak Bluni PLLC (57) ABSTRACT

An electrical device that includes a first electrode and a second electrode that are separated from one another so as to form a gap structure. A layer of protective material spans the gap structure to contact the first electrode and the second electrode. A dimension of the gap structure, corresponding to a separation distance between the first electrode and the second electrode, is varied and includes a minimum separation distance that coincides with a critical path of the layer of protective material between the first electrode and the second electrode.

16 Claims, 3 Drawing Sheets

(56) References Cited

U.S. PATENT DOCUMENTS

| | | |
|---|---|---|
| 3,393,338 A * | 7/1968 | Lee et al. ............... 313/154 |
| 3,685,026 A | 8/1972 | Wakabayashi et al. |
| 3,685,028 A | 8/1972 | Wakabayashi et al. |
| 3,723,635 A | 3/1973 | Smith |
| 3,757,153 A * | 9/1973 | James ............... 313/325 |
| 3,808,576 A | 4/1974 | Castonguay et al. |
| 3,926,916 A | 12/1975 | Mastrangelo |
| 3,977,957 A | 8/1976 | Kosowsky et al. |
| 4,113,899 A | 9/1978 | Henry et al. |
| 4,133,735 A | 1/1979 | Afromowitz et al. |
| 4,252,692 A | 2/1981 | Taylor et al. |
| 4,331,948 A | 5/1982 | Malinaric et al. |
| 4,359,414 A | 11/1982 | Mastrangelo |
| 4,405,432 A | 9/1983 | Kosowsky |
| 4,439,809 A | 3/1984 | Weight et al. |
| 4,506,285 A | 3/1985 | Einzinger |
| 4,591,411 A | 5/1986 | Reimann |
| 4,642,160 A | 2/1987 | Burgess |
| 4,702,860 A | 10/1987 | Kinderov et al. |
| 4,726,877 A | 2/1988 | Fryd et al. |
| 4,726,991 A | 2/1988 | Hyatt et al. |
| 4,799,128 A | 1/1989 | Chen |
| 4,888,574 A | 12/1989 | Rice et al. |
| 4,892,776 A | 1/1990 | Rice |
| 4,918,033 A | 4/1990 | Bartha et al. |
| 4,928,199 A | 5/1990 | Diaz et al. |
| 4,935,584 A | 6/1990 | Boggs |
| 4,977,357 A | 12/1990 | Shrier |
| 4,992,333 A | 2/1991 | Hyatt |
| 4,996,945 A | 3/1991 | Dix, Jr. |
| 5,068,634 A | 11/1991 | Shrier |
| 5,092,032 A | 3/1992 | Murakami |
| 5,095,626 A | 3/1992 | Kitamura et al. |
| 5,099,380 A | 3/1992 | Childers et al. |
| 5,142,263 A | 8/1992 | Childers et al. |
| 5,148,355 A | 9/1992 | Lowe et al. |
| 5,183,698 A | 2/1993 | Stephenson et al. |
| 5,189,387 A | 2/1993 | Childers et al. |
| 5,246,388 A | 9/1993 | Collins et al. |
| 5,248,517 A | 9/1993 | Shrier et al. |
| 5,252,195 A | 10/1993 | Kobayashi et al. |
| 5,260,108 A | 11/1993 | Braren et al. |
| 5,260,848 A | 11/1993 | Childers |
| 5,262,754 A | 11/1993 | Collins |
| 5,278,535 A | 1/1994 | Xu et al. |
| 5,282,312 A | 2/1994 | DiStefano et al. |
| 5,294,374 A | 3/1994 | Martinez et al. |
| 5,295,297 A | 3/1994 | Kitamura et al. |
| 5,300,208 A | 4/1994 | Angelopoulos et al. |
| 5,317,801 A | 6/1994 | Tanaka et al. |
| 5,340,641 A | 8/1994 | Xu |
| 5,347,258 A | 9/1994 | Howard et al. |
| 5,354,712 A | 10/1994 | Ho et al. |
| 5,367,764 A | 11/1994 | DiStefano et al. |
| 5,378,858 A | 1/1995 | Bruckner et al. |
| 5,380,679 A | 1/1995 | Kano |
| 5,393,597 A | 2/1995 | Childers et al. |
| 5,403,208 A | 4/1995 | Felcman et al. |
| 5,404,637 A | 4/1995 | Kawakami |
| 5,413,694 A | 5/1995 | Dixon et al. |
| 5,416,662 A | 5/1995 | Kurasawa et al. |
| 5,440,075 A | 8/1995 | Kawakita et al. |
| 5,444,593 A | 8/1995 | Allina |
| 5,476,471 A | 12/1995 | Shifrin et al. |
| 5,481,795 A | 1/1996 | Hatakeyama et al. |
| 5,483,407 A | 1/1996 | Anastasio et al. |
| 5,487,218 A | 1/1996 | Bhatt et al. |
| 5,493,146 A | 2/1996 | Pramanik et al. |
| 5,501,350 A | 3/1996 | Yoshida et al. |
| 5,502,889 A | 4/1996 | Casson et al. |
| 5,510,629 A | 4/1996 | Karpovich et al. |
| 5,550,400 A | 8/1996 | Takagi et al. |
| 5,557,136 A | 9/1996 | Gordon et al. |
| 5,654,564 A | 8/1997 | Mohsen |
| 5,669,381 A | 9/1997 | Hyatt |
| 5,685,070 A | 11/1997 | Alpaugh et al. |
| 5,708,298 A | 1/1998 | Masayuki et al. |
| 5,714,794 A | 2/1998 | Tsuyama et al. |
| 5,734,188 A | 3/1998 | Murata et al. |
| 5,744,759 A | 4/1998 | Ameen et al. |
| 5,781,395 A | 7/1998 | Hyatt |
| 5,802,714 A | 9/1998 | Kobayashi et al. |
| 5,807,509 A | 9/1998 | Shrier et al. |
| 5,808,351 A | 9/1998 | Nathan et al. |
| 5,834,160 A | 11/1998 | Ferry et al. |
| 5,834,824 A | 11/1998 | Shepherd et al. |
| 5,834,893 A | 11/1998 | Bulovic et al. |
| 5,848,467 A | 12/1998 | Khandros et al. |
| 5,856,910 A | 1/1999 | Yurchenco et al. |
| 5,865,934 A | 2/1999 | Yamamoto et al. |
| 5,869,869 A | 2/1999 | Hively |
| 5,874,902 A | 2/1999 | Heinrich et al. |
| 5,906,042 A | 5/1999 | Lan et al. |
| 5,910,685 A | 6/1999 | Watanabe et al. |
| 5,926,951 A | 7/1999 | Khandros et al. |
| 5,940,683 A | 8/1999 | Holm et al. |
| 5,946,555 A | 8/1999 | Crumly et al. |
| 5,955,762 A | 9/1999 | Hively |
| 5,956,612 A | 9/1999 | Elliott et al. |
| 5,962,815 A | 10/1999 | Lan et al. |
| 5,970,321 A | 10/1999 | Hively |
| 5,972,192 A | 10/1999 | Dubin et al. |
| 5,977,489 A | 11/1999 | Crotzer et al. |
| 6,013,358 A | 1/2000 | Winnett et al. |
| 6,023,028 A | 2/2000 | Neuhalfen |
| 6,059,983 A * | 5/2000 | Noble ............... 427/96.4 |
| 6,064,094 A | 5/2000 | Intrater et al. |
| 6,108,184 A | 8/2000 | Minervini et al. |
| 6,114,672 A | 9/2000 | Iwasaki et al. |
| 6,130,459 A | 10/2000 | Intrater |
| 6,160,695 A | 12/2000 | Winnett et al. |
| 6,172,590 B1 | 1/2001 | Shrier et al. |
| 6,184,280 B1 | 2/2001 | Shibuta |
| 6,191,928 B1 * | 2/2001 | Rector et al. ............... 361/127 |
| 6,198,392 B1 | 3/2001 | Hahn et al. |
| 6,211,554 B1 | 4/2001 | Whitney et al. |
| 6,239,687 B1 | 5/2001 | Shrier et al. |
| 6,251,513 B1 | 6/2001 | Rector et al. |
| 6,310,752 B1 | 10/2001 | Shrier et al. |
| 6,316,734 B1 | 11/2001 | Yang |
| 6,340,789 B1 | 1/2002 | Petritsch et al. |
| 6,351,011 B1 | 2/2002 | Whitney et al. |
| 6,373,719 B1 | 4/2002 | Behling et al. |
| 6,407,411 B1 | 6/2002 | Wojnarowski et al. |
| 6,433,394 B1 | 8/2002 | Intrater |
| 6,448,900 B1 | 9/2002 | Chen |
| 6,455,916 B1 | 9/2002 | Robinson |
| 6,468,593 B1 | 10/2002 | Iizawa et al. |
| 6,512,458 B1 | 1/2003 | Kobayashi et al. |
| 6,534,422 B1 | 3/2003 | Ichikawa et al. |
| 6,542,065 B2 | 4/2003 | Shrier et al. |
| 6,549,114 B2 | 4/2003 | Whitney et al. |
| 6,570,765 B2 | 5/2003 | Behling et al. |
| 6,593,597 B2 | 7/2003 | Sheu |
| 6,628,498 B2 | 9/2003 | Whitney et al. |
| 6,642,297 B1 | 11/2003 | Hyatt et al. |
| 6,657,532 B1 | 12/2003 | Shrier et al. |
| 6,693,508 B2 | 2/2004 | Whitney et al. |
| 6,741,217 B2 | 5/2004 | Toncich et al. |
| 6,797,145 B2 | 9/2004 | Kosowsky |
| 6,882,051 B2 | 4/2005 | Majumdar et al. |
| 6,911,676 B2 | 6/2005 | Yoo |
| 6,916,872 B2 | 7/2005 | Yadav et al. |
| 6,981,319 B2 | 1/2006 | Shrier |
| 7,034,652 B2 | 4/2006 | Whitney et al. |
| 7,049,926 B2 | 5/2006 | Shrier et al. |
| 7,053,468 B2 | 5/2006 | Lee |
| 7,064,353 B2 | 6/2006 | Bhat |
| 7,132,697 B2 | 11/2006 | Weimer et al. |
| 7,132,922 B2 | 11/2006 | Harris et al. |
| 7,141,184 B2 | 11/2006 | Chacko et al. |
| 7,173,288 B2 | 2/2007 | Lee et al. |
| 7,183,891 B2 | 2/2007 | Harris et al. |
| 7,202,770 B2 | 4/2007 | Harris et al. |

(56) References Cited

U.S. PATENT DOCUMENTS

| | | |
|---|---|---|
| 7,205,613 B2 | 4/2007 | Fjelstad et al. |
| 7,218,492 B2 | 5/2007 | Shrier |
| 7,320,762 B2 | 1/2008 | Greuter et al. |
| 7,417,194 B2 | 8/2008 | Shrier |
| 7,446,030 B2 | 11/2008 | Kosowsky |
| 7,528,467 B2 | 5/2009 | Lee |
| 7,609,141 B2 | 10/2009 | Harris et al. |
| 7,695,644 B2 | 4/2010 | Kosowsky et al. |
| 2002/0004258 A1 | 1/2002 | Nakayama et al. |
| 2002/0061363 A1 | 5/2002 | Halas et al. |
| 2003/0008989 A1 | 1/2003 | Gore et al. |
| 2003/0010960 A1 | 1/2003 | Greuter et al. |
| 2003/0079910 A1 | 5/2003 | Kosowsky |
| 2003/0151029 A1 | 8/2003 | Hsu et al. |
| 2003/0207978 A1 | 11/2003 | Yadav et al. |
| 2003/0218851 A1 | 11/2003 | Harris et al. |
| 2004/0057186 A1* | 3/2004 | Chawgo ............... 361/118 |
| 2004/0063294 A1 | 4/2004 | Durocher et al. |
| 2004/0095658 A1 | 5/2004 | Buretea et al. |
| 2004/0154828 A1 | 8/2004 | Moller et al. |
| 2004/0160300 A1 | 8/2004 | Shrier |
| 2004/0201941 A1 | 10/2004 | Harris et al. |
| 2004/0211942 A1 | 10/2004 | Clark et al. |
| 2004/0262583 A1 | 12/2004 | Lee |
| 2005/0026334 A1 | 2/2005 | Knall |
| 2005/0039949 A1 | 2/2005 | Kosowsky |
| 2005/0057867 A1 | 3/2005 | Harris et al. |
| 2005/0083163 A1 | 4/2005 | Shrier |
| 2005/0106098 A1 | 5/2005 | Tsang et al. |
| 2005/0208304 A1 | 9/2005 | Collier et al. |
| 2005/0218380 A1 | 10/2005 | Gramespacher et al. |
| 2005/0274455 A1 | 12/2005 | Extrand |
| 2005/0274956 A1 | 12/2005 | Bhat |
| 2005/0275070 A1 | 12/2005 | Hollingsworth |
| 2006/0035081 A1 | 2/2006 | Morita et al. |
| 2006/0060880 A1 | 3/2006 | Lee et al. |
| 2006/0142455 A1 | 6/2006 | Agarwal et al. |
| 2006/0152334 A1 | 7/2006 | Maercklein et al. |
| 2006/0166474 A1 | 7/2006 | Vereecken et al. |
| 2006/0167139 A1 | 7/2006 | Nelson et al. |
| 2006/0181826 A1 | 8/2006 | Dudnikov, Jr. et al. |
| 2006/0181827 A1 | 8/2006 | Dudnikov, Jr. et al. |
| 2006/0193093 A1 | 8/2006 | Bertin et al. |
| 2006/0199390 A1 | 9/2006 | Dudnikov, Jr. et al. |
| 2006/0211837 A1 | 9/2006 | Ko et al. |
| 2006/0234127 A1 | 10/2006 | Kim et al. |
| 2006/0291127 A1 | 12/2006 | Kim et al. |
| 2007/0114640 A1 | 5/2007 | Kosowsky |
| 2007/0126018 A1 | 6/2007 | Kosowsky |
| 2007/0139848 A1 | 6/2007 | Harris et al. |
| 2007/0146941 A1 | 6/2007 | Harris et al. |
| 2007/0166976 A1 | 7/2007 | Myung |
| 2007/0208243 A1 | 9/2007 | Gabriel et al. |
| 2008/0023675 A1 | 1/2008 | Kosowsky |
| 2008/0029405 A1 | 2/2008 | Kosowsky |
| 2008/0032049 A1 | 2/2008 | Kosowsky |
| 2008/0035370 A1 | 2/2008 | Kosowsky |
| 2008/0045770 A1 | 2/2008 | Sigmund et al. |
| 2008/0073114 A1 | 3/2008 | Kosowsky |
| 2008/0313576 A1 | 12/2008 | Kosowsky |
| 2009/0044970 A1 | 2/2009 | Kosowsky |
| 2009/0050856 A1 | 2/2009 | Kosowsky |
| 2009/0212266 A1 | 8/2009 | Kosowsky |
| 2009/0220771 A1 | 9/2009 | Fleming et al. |
| 2009/0242855 A1 | 10/2009 | Fleming et al. |
| 2009/0256669 A1 | 10/2009 | Kosowsky |
| 2010/0047535 A1 | 2/2010 | Kosowsky et al. |
| 2010/0065785 A1 | 3/2010 | Kosowsky et al. |
| 2010/0090176 A1 | 4/2010 | Kosowsky et al. |
| 2010/0090178 A1 | 4/2010 | Kosowsky et al. |
| 2010/0109834 A1 | 5/2010 | Kosowsky et al. |
| 2010/0139956 A1 | 6/2010 | Kosowsky et al. |
| 2010/0141376 A1 | 6/2010 | Kosowsky et al. |
| 2010/0147697 A1 | 6/2010 | Kosowsky et al. |
| 2010/0148259 A1 | 6/2010 | Dyer et al. |
| 2010/0155670 A1 | 6/2010 | Kosowsky et al. |
| 2010/0155671 A1 | 6/2010 | Kosowsky et al. |
| 2010/0155672 A1 | 6/2010 | Kosowsky et al. |
| 2010/0159259 A1 | 6/2010 | Kosowsky et al. |
| 2010/0187483 A1 | 7/2010 | Fleming et al. |
| 2010/0263200 A1 | 10/2010 | Kosowsky |
| 2010/0264224 A1 | 10/2010 | Kosowsky |
| 2010/0264225 A1 | 10/2010 | Kosowsky |
| 2010/0270545 A1 | 10/2010 | Kosowsky |
| 2010/0270546 A1 | 10/2010 | Kosowsky |
| 2010/0270588 A1 | 10/2010 | Kosowsky et al. |
| 2010/0271831 A1 | 10/2010 | Kosowsky et al. |
| 2010/0281453 A1 | 11/2010 | Kosowsky et al. |
| 2010/0281454 A1 | 11/2010 | Kosowsky et al. |

FOREIGN PATENT DOCUMENTS

| | | | |
|---|---|---|---|
| DE | 10115333 A1 | | 1/2002 |
| DE | 102004049053 | * | 5/2005 |
| DE | 102004049053 A1 | | 5/2005 |
| DE | 102006047377 A1 | | 4/2008 |
| EP | 0 790 758 A1 | | 8/1997 |
| EP | 1 003 229 A1 | | 5/2000 |
| EP | 1 245 586 A2 | | 10/2002 |
| EP | 1 580 809 A2 | | 9/2005 |
| EP | 1 542 240 A2 | | 6/2006 |
| EP | 1 857 871 A1 | | 4/2007 |
| EP | 1 990 834 A2 | | 11/2008 |
| JP | 56091464 A | | 7/1981 |
| JP | 63 195275 A | | 8/1988 |
| JP | 2000 062076 A | | 2/2000 |
| WO | WO 88/00526 A1 | | 1/1988 |
| WO | WO 89/06859 A2 | | 7/1989 |
| WO | WO 96/02922 A2 | | 2/1996 |
| WO | WO 96/02924 A1 | | 2/1996 |
| WO | WO 96/02944 A1 | | 2/1996 |
| WO | WO 97/26665 A1 | | 7/1997 |
| WO | WO 98/23018 A1 | | 5/1998 |
| WO | WO 99/24992 A1 | | 5/1999 |
| WO | WO 99/49525 A1 | | 9/1999 |
| WO | WO 02/103085 A1 | | 12/2002 |
| WO | WO 2005/100426 A1 | | 12/2006 |
| WO | WO 2006/130366 A2 | | 12/2006 |
| WO | WO 2007/062170 A2 | | 5/2007 |
| WO | WO 2007/062171 A2 | | 5/2007 |
| WO | WO 2008/016858 A1 | | 2/2008 |
| WO | WO 2008/016859 A1 | | 2/2008 |
| WO | WO 2008/024207 A1 | | 2/2008 |
| WO | WO 2008/036984 A2 | | 3/2008 |
| WO | WO 2008/153584 A1 | | 12/2008 |
| WO | WO 2009/026299 A1 | | 2/2009 |

OTHER PUBLICATIONS

U.S. Appl. No. 12/954,605, filed Nov. 24, 2010, Shi et al.

Breton et al., "Mechanical properties of multiwall carbon nanotubes/epoxy composites: influence of network morphology," Carbon Elsevier UK, vol. 42, No. 5-6, pp. 1027-1030 (2004).

Celzard, A., et al., "Conduction Mechanisms in Some Graphite-polymer Composites: The Effect of a Direct-current Electric Field", Journal of Physics: Condensed Matter, 9 (1997) pp. 2225-2237.

Communication of Nov. 11, 2009 with Examination Report in European Patent Application No. 07 813 509.2 5 pages.

Communication of Nov. 23, 2009 with Supp European Search Report and Opinion, European Application No. 06 838 319.9 7 pages.

Communication pf Nov. 9, 2009 with Examination Report in European Patent Application No. 07 813 508.4, 5 pages.

Communication with Examination Report mailed Dec. 23, 2009 in European app. 06838276.1-2203, 6 pgs.

Examination Report for European Application 07813508.4-1218 mailed Jul. 2, 2010.

Examination Report for European Application 06838319.9 mailed May 7, 2010.

Examination Report for European Application 07813509.2-1218 mailed Jul. 2, 2010.

Extended European Search Report for European Application 10158080.1 mailed Jul. 1, 2010.

(56) References Cited

OTHER PUBLICATIONS

Facchetti, Antonio, "Semiconductors for Organic Transistors", Materials Today, vol. 10, No. 3, pp. 28-37, Mar. 2007.
Final Office Action mailed Oct. 13, 2010 in U.S. Appl. No. 11/829,946.
Final Office Action mailed Oct. 13, 2010 in U.S. Appl. No. 12/714,358.
Fullerene Chemistry—Wikipedia, http://en.wikipedia.org/wiki/Fullerene/chemistry, 6 pages, printed Apr. 8, 2010.
Granstrom et al., "laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
International Preliminary Report on Patentability for International Application PCT/US06/045291, ISA/US, mailed Mar. 24, 2009, 8 pages.
International Preliminary Report on Patentability for International Application PCT/US2008/073603 mailed Mar. 4, 2010, 7 pages.
International Preliminary Report on Patentability in International Application PCT/US2007/074677, Feb. 3, 2009, 8 pages.
International Preliminary Report on Patentability for International Application PCT/US07/079377 mailed Dec. 30, 2009, 8 pages.
International Preliminary Report on Patentability mailed Oct. 28, 2010 in PCT/US2009/040384.
International Preliminary Report on Patentability mailed Oct. 7, 2010 in PCT/US2009/038429.
International Search Report and Written Opinion mailed Nov. 12, 2009 in International Application PCT/US2009/054062, 15 pages.
International Search Report and Written Opinion in International Application PCT/US2009/038429 mailed Aug. 18, 2009, 20 pages.
International Search Report and Written Opinion in International Application PCT/US2007/079345, mailed Nov. 7, 2008, 25 pages.
International Search Report and Written Opinion of the International Searching Authority in International Application PCT/US2008/073603, US Patent Office, Nov. 17, 2008, 7 pages.
International Search Report and Written Opinion of the International Searching Authority in International Application PCT/US2007/074677, European Patent Office, Dec. 5, 2007, 13 pages.
International Search Report and Written Opinion of the International Searching Authority in International Application PCT/US2007/079377, European Patent Office, Mar. 7, 2008, 13 pages.
International Search Report and Written Opinion of the International Searching Authority in International Application PCT/US06/45292, United States Patent Office, Feb. 14, 2008, 10 pages.
International Search Report and Written Opinion of the International Searching Authority in International Application PCT/US06/45291, United States Patent Office, Mar. 5, 2008, 14 pages.
International Search Report, Written Opinion, and Notice of Transmittal of same mailed Mar. 18, 2010 for International Application PCT/US2010/021889 15 pages.
International Search Report and Written Opinion of the International Searching Authority in International Application PCT/US09/040384, European Patent Office, Jul. 2, 2009, 15 pages.
International Search Report and Written Opinion mailed Nov. 17, 2009 in International Application PCT/US2009/057209, 14 pages.
International Search Report, Written Opinion and Notice of Transmittal of Same mailed Apr. 16, 2010 for International Application PCT/US2009/062844 20 pages.
International Search Report, Written Opinion and Notice of Transmittal of Same mailed Apr. 20, 2010 for International Application PCT/US2009/059134 22 pages.
Levinson et al., "The Physics of metal oxide varistors," J. Applied Physics, 46(3): 1332-1341 (1975).
Modine, F.A. And Hyatt, H.M. "New Varistor Material", Journal of Applied Physics, 64 (8), Oct. 15, 1988, pp. 4229-4232.
Non-Final Office Action dated Apr. 14, 2010 in U.S. Appl. No. 12/714,358, 17 pages.
Non-Final Office Action mailed Dec. 1, 2010 in U.S. Appl. No. 12/193,603.
Non-Final Office Action mailed Oct. 22, 2010 in U.S. Appl. No. 12/820,939.
Non-Final Office Action mailed Oct. 14, 2010 in U.S. Appl. No. 12/356,490.
Non-Final Office Action mailed Jul. 20, 2010 in U.S. Appl. No. 11/562,222.
Non-Final Office Action mailed Oct. 7, 2010 in U.S. Appl. No. 12/832,040.
Non-Final Office Action mailed Nov. 10, 2010 in U.S. Appl. No. 12/571,318.
Non-Final Office Action mailed Apr. 20, 2010 in U.S. Appl. No. 11/829,946, 20 pages.
Non-Final Office Action mailed Sep. 27, 2010 in U.S. Appl. No. 12/703,723.
Non-Final Office Action mailed Sep. 28, 2010 in U.S. Appl. No. 12/703,674.
Non-Final Office Action dated Apr. 13, 2010 in U.S. Appl. No. 12/714,354, 17 pages.
Non-Final Office Action mailed Dec. 21, 2010 in U.S. Appl. No. 11/860,522.
Non-Final Office Action mailed Sep. 28, 2010 in U.S. Appl. No. 12/703,701.
Non-Final Office Action mailed Oct. 6, 2010 in U.S. Appl. No. 12/714,354.
Notice of Allowance mailed Jun. 21, 2010 in U.S. Appl. No. 11/860,530.
Notice of Allowance Jan. 14, 2010 U.S. Appl. No. 11/562,289 9 pages.
Notice of Allowance mailed Sep. 7, 2010 in U.S. Appl. No. 11/562,289.
Office Action Issued Jul. 29, 2010 in Chinese Application No. 200780028607.9.
Onoda et al., "Photoinduced Charge Transfer of Conducting Polymer Compositions," IEICE Trans. Electronics, vol. E81-C(7), pp. 1051-1056 (1998).
Raffaelle et al., "Nanomaterial Development for Polymeric Solar Cells," IEEE 4th World Conf on Photovoltaic energy Conversion, pp. 186-189 (2006).
Reese, Colin and Bao, Zhenan, "Organic Single-Crystal Field-Effect Transistors", Materials Today, vol. 10, No. 3, pp. 20-27, Mar. 2007.
Saunders et al., "Nanoparticle-polymer photovoltaic cells," Adv. Colloid Int. Sci., vol. 138, No. 1, pp. 1-23 (2007).
Translation of Office Action of Jul. 7, 2010 in Chinese Application 200680043524.2.
Translation of Office Action of Jul. 12, 2010 in Chinese Application 200780028617.2.

\* cited by examiner

GEOMETRIC CONFIGURATION OR ALIGNMENT OF PROTECTIVE MATERIAL IN A GAP STRUCTURE FOR ELECTRICAL DEVICES

RELATED APPLICATIONS

This application claims benefit of priority to Provisional U.S. Patent Application No. 61/241,000, filed on Sep. 9, 2009; the aforementioned priority application being hereby incorporated by reference in its entirety.

TECHNICAL FIELD

Embodiments described herein pertain to a geometric configuration or alignment for including electrically protective material in devices.

BACKGROUND

Voltage switchable dielectric (VSD) materials are known to be materials that are insulative at low voltages and conductive at higher voltages. These materials are typically composites comprising of conductive, semiconductive, and insulative particles in an insulative polymer matrix. These materials are used for transient protection of electronic devices, most notably electrostatic discharge protection (ESD) and electrical overstress (EOS). Generally, VSD material behaves as a dielectric, unless a characteristic voltage or voltage range is applied, in which case it behaves as a conductor. Various kinds of VSD material exist. Examples of voltage switchable dielectric materials are provided in references such as U.S. Pat. No. 4,977,357, U.S. Pat. No. 5,068,634, U.S. Pat. No. 5,099,380, U.S. Pat. No. 5,142,263, U.S. Pat. No. 5,189,387, U.S. Pat. No. 5,248,517, U.S. Pat. No. 5,807,509, WO 96/02924, and WO 97/26665, all of which are incorporated by reference herein.

VSD materials may be formed using various processes and materials or compositions. One conventional technique provides that a layer of polymer is filled with high levels of metal particles to very near the percolation threshold, typically more than 25% by volume. Semiconductor and/or insulator materials are then added to the mixture.

Another conventional technique provides for forming VSD material by mixing doped metal oxide powders, then sintering the powders to make particles with grain boundaries, and then adding the particles to a polymer matrix to above the percolation threshold.

Other techniques and compositions for forming VSD material are described in U.S. patent application Ser. No. 11/829,946, entitled VOLTAGE SWITCHABLE DIELECTRIC MATERIAL HAVING CONDUCTIVE OR SEMI-CONDUCTIVE ORGANIC MATERIAL; and U.S. patent application Ser. No. 11/829,948, entitled VOLTAGE SWITCHABLE DIELECTRIC MATERIAL HAVING HIGH ASPECT RATIO PARTICLES.

BRIEF DESCRIPTION OF THE DRAWINGS

FIG. 6 illustrates an alternative triangular geometric configuration in which a gap structure formed between two electrodes has multiple critical paths from which the protective layer can be switched on.

DESCRIPTION

Embodiments described herein include an electrical device that includes a first electrode and a second electrode that are separated from one another so as to form a gap structure. A layer of protective material spans the gap structure to contact the first electrode and the second electrode. In at least some embodiments, the layer of protective material is (i) a dielectric in absence of a voltage that exceeds a characteristic voltage level, and (ii) a conductor with application of a voltage that exceeds a characteristic voltage level of the composition. A dimension of the gap structure, corresponding to a separation distance between the first electrode and the second electrode, is varied and includes a minimum separation distance that coincides with a critical path of the layer of protective material between the first electrode and the second electrode.

Embodiments described herein are applicable to numerous types of electrical devices in which a gap structure is formed to separate two electrodes, using material that is protective against electrical events. For example, embodiments described herein can be implemented on a circuit board, as a surge protector, or with a discrete semiconductor package. Numerous other applications exist.

Examples of such electrically protective material includes varistors and voltage switchable dielectric (VSD) material. In absence of a transient electrical event, the protective material is non-conductive, and the two electrodes are not separated. When a transient electrical event occurs, the protective material switches, so that the two electrodes are electrically connected. The protective material may be provided as part of the gap structure in order to enable, for example, the formation of grounding paths when electrical events such as ESD occur.

In this context, embodiments recognize that the protective material may be geometrically shaped or aligned in separating the two electrodes, in order to enhance desired electrical performance of the protective material. In particular, embodiments recognize that some forms of protective material may underperform in presence of relatively weak transient electrical events that are otherwise sufficient in voltage to cause the protective material to switch (i.e. voltage greater than clamp or trigger). Weak electrical events may carry sufficient voltage to switch the protective material into a conductive state, but cause the material to underperform for lack of energy. It is believed that such low energy switching events only trigger some portions or 'paths' within the protective material into the conductive state, while a remainder of the protective material is unswitched. When only some portion of the protective material is switched, the weakest potential path (e.g. a portion of protective material that carries a defect) within the protective material may coincide with the portion of the material that actually switches. Because only a portion of the protective material switches with application of the low energy switching event, the protective material is more likely to fail.

Accordingly, some embodiments provide for gap structures that are structured as follows: (i) the protective material is positioned to be offset (or distributed unevenly) in its separation of the two electrodes, (ii) the protective material provided in the gap structure is asymmetrical in shape, and/or (iii) the electrode and/or protective material is shaped so that separation distance between the two electrodes at various points on the respective electrodes varies.

Overview of VSD Material

As used herein, "voltage switchable material" or "VSD material" is any composition, or combination of compositions, that has a characteristic of being dielectric or non-conductive, unless a field or voltage is applied to the material that exceeds a characteristic level of the material, in which case the material becomes conductive. Thus, VSD material is a dielectric unless voltage (or field) exceeding the characteristic level (e.g. such as provided by ESD events) is applied to the material, in which case the VSD material is switched into a conductive state. VSD material can further be characterized as a nonlinear resistance material. With an embodiment such as described, the characteristic voltage may range in values that exceed the operational voltage levels of the circuit or device several times over. Such voltage levels may be of the order of transient conditions, such as produced by electrostatic discharge, although embodiments may include use of planned electrical events. Furthermore, one or more embodiments provide that in the absence of the voltage exceeding the characteristic voltage, the material behaves similar to the binder.

Still further, an embodiment provides that VSD material may be characterized as material comprising a binder mixed in part with conductor or semi-conductor particles. In the absence of voltage exceeding a characteristic voltage level, the material as a whole adapts the dielectric characteristic of the binder. With application of voltage exceeding the characteristic level, the material as a whole adapts conductive characteristics.

Many compositions of VSD material provide desired 'voltage switchable' electrical characteristics by dispersing a quantity of conductive materials in a polymer matrix to just below the percolation threshold, where the percolation threshold is defined statistically as the threshold by which a conduction path is likely formed across a thickness of the material. Other materials, such as insulators or semiconductors, are dispersed in the matrix to better control the percolation threshold. Still further, other compositions of VSD material, including some that include particle constituents such as core shell particles or other particles may load the particle constituency above the percolation threshold.

As described with some embodiments, the VSD material may be situated on an electrical device in order to protect a circuit or electrical component of device (or specific sub-region of the device) from electrical events, such as ESD or EOS. Accordingly, one or more embodiments provide that VSD material has a characteristic voltage level that exceeds that of an operating circuit or component of the device.

According to embodiments described herein, the constituents of VSD material may be uniformly mixed into a binder or polymer matrix. In one embodiment, the mixture is dispersed at nanoscale, meaning the particles that comprise the organic conductive/semi-conductive material are nano-scale in at least one dimension (e.g. cross-section) and a substantial number of the particles that comprise the overall dispersed quantity in the volume are individually separated (so as to not be agglomerated or compacted together).

Still further, an electronic device may be provided with VSD material in accordance with any of the embodiments described herein. Such electrical devices may include substrate devices, such as printed circuit boards, semiconductor packages, discrete devices, Light Emitting Diodes (LEDs), and radio-frequency (RF) components.

Figure 1:
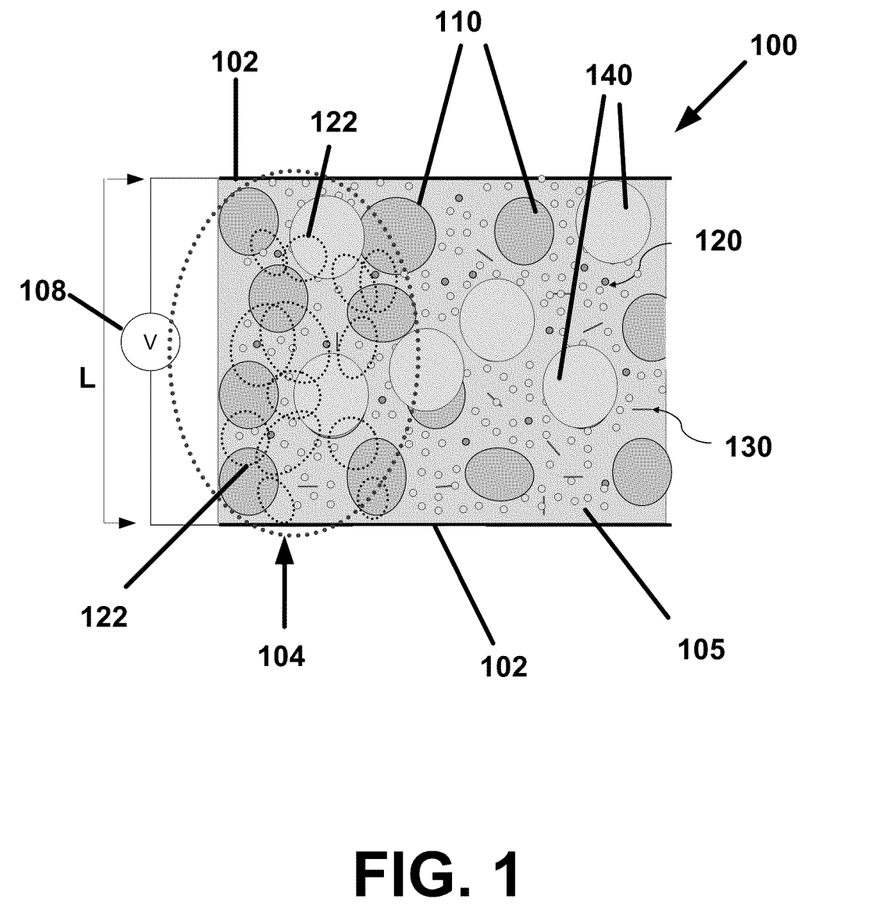
FIG. 1 is an illustrative (not to scale) sectional view of a layer or thickness of VSD material, depicting the constituents of VSD material in accordance with various embodiments.

FIG. 1 is an illustrative (not to scale) sectional view of a layer or thickness of VSD material, depicting the constituents of VSD material in accordance with various embodiments. As depicted, VSD material 100 includes binder 105 and various types of particle constituents, dispersed in the binder in various concentrations. The particle constituents of the VSD material may include a combination of conductive particles 110, semiconductor particles 120, nano-dimensioned particles 130 and/or other particles 140 (e.g. core shell particles or varistor particles).

In some embodiments, the VSD composition omits the use of conductive particles 110, semiconductive particles 120, or nano-dimensioned particles 130. For example, the particle constituency of the VSD material may omit semiconductive particles 120. Thus, the type of particle constituent that are included in the VSD composition may vary, depending on the desired electrical and physical characteristics of the VSD material.

According to embodiments described herein, the matrix binder 105 is formulated from polymer material that has enhanced electron mobility at high electric fields. In some embodiments, the polymer material used for binder 105 includes high field conductive ("HFC") polymers, such as a polyacrylate (e.g. Hexanedioldiacrylate). As an addition or alternative, the polymer material includes blends or mixtures of polymers (monomers) with high electron mobility with polymers (monomers) with low electron mobility. Such polymers (or blends) with enhanced electron mobility are capable of carrying 1.0E-9 current at approximately 400 volts per mil (extrapolated from empirical data at 1000 volts and across 2.5 mil gap). According to variations, the polymer binder 105 may also include mixtures of standard polymers (e.g. EPON or GP611) with HFC polymers or polymers with enhanced electron mobility under high field, the polymer binder 105 may be enhanced with use of nano-dimensioned particles 130, which are mixed into the binder to form a doped variant of the binder 105.

Examples of conductive materials 110 include metals such as copper, aluminum, nickel, silver, gold, titanium, stainless steel, nickel phosphorus, niobium, tungsten, chrome, other metal alloys, or conductive ceramics like titanium diboride or titanium nitride. Examples of semiconductive material 120 include both organic and inorganic semiconductors. Some inorganic semiconductors include silicon carbide, Boron-nitride, aluminum nitride, nickel oxide, zinc oxide, zinc sulfide, bismuth oxide, titanium dioxide, cerium oxide, bismuth oxide, in oxide, indium in oxide, antimony in oxide, and iron oxide, praseodynium oxide. The specific formulation and composition may be selected for mechanical and electrical properties that best suit the particular application of the VSD material.

The nano-dimensioned particles 130 may be of one or more types. Depending on the implementation, at least one constituent that comprises a portion of the nano-dimensioned particles 130 are (i) organic particles (e.g. carbon nanotubes (CNT), graphenes, C60 fullerenes); or (ii) inorganic particles (metallic, metal oxide, nanorods, or nanowires). The nano-dimensioned particles may have high-aspect ratios (HAR), so as to have aspect ratios that exceed at least 10:1 (and may exceed 1000:1 or more). Specific examples of such particles include copper, nickel, gold, silver, cobalt, zinc oxide, in oxide, silicon carbide, gallium arsenide, aluminum oxide, aluminum nitride, titanium dioxide, antimony, Boron-nitride, antimony in oxide, indium in oxide, indium zinc oxide, bismuth oxide, cerium oxide, and antimony zinc oxide. In at least some embodiments, the nano-dimensioned particles correspond to semiconductive fillers that form part of the binder. Such fillers can be uniformly dispersed in the polymer matrix or binder at various concentrations. Some of the nano-dimensioned particles (e.g. Antimony in oxide (ATO), CNT, zinc oxide, bismuth oxide ($Bi_2O_3$)) enhance the electron mobility of the binder 105 at high electric fields.

The dispersion of the various classes of particles in the matrix 105 is such that the VSD material 100 is non-layered and uniform in its composition, while exhibiting electrical characteristics of voltage switchable dielectric material. Generally, the characteristic voltage of VSD material is measured at volts/length (e.g. per 5 mil), although other field measurements may be used as an alternative to voltage. Accordingly, a voltage 108 applied across the boundaries 102 of the VSD material layer may switch the VSD material 100 into a conductive state if the voltage exceeds the characteristic voltage for the gap distance L.

As depicted by a sub-region 104 (which is intended to be representative of the VSD material 100), VSD material 100 comprises particle constituents that individually carry charge when voltage or field acts on the VSD composition. If the field/voltage is above the trigger threshold, sufficient charge is carried by at least some types of particles to switch at least a portion of the composition 100 into a conductive state. More specifically, as shown for representative sub-region 104, individual particles (of types such as conductor particles, core shell particles or other semiconductive or compound particles) acquire conduction regions 122 in the polymer binder 105 when a voltage or field is present. The voltage or field level at which the conduction regions 122 are sufficient in magnitude and quantity to result in current passing through a thickness of the VSD material 100 (e.g. between boundaries 102) coincides with the characteristic trigger voltage of the composition. The presence of conductive particles is believed to amplify the external voltage 108 within the thickness of the composition, so that the electric field of the individual conduction regions 122 is more than an order of magnitude greater than the field of the applied voltage 108.

FIG. 1 illustrates presence of conduction regions 122 in a portion of the overall thickness. The portion or thickness of the VSD material 100 provided between the boundaries 102 is representative of the separation between lateral or vertically displaced electrodes. When voltage is present, some or all of the portion of VSD material is affected to increase the magnitude or count of the conduction regions in that region. When voltage is applied, the presence of conduction regions varies across the thickness (either vertical or lateral thickness) of the VSD composition, depending on, for example, the location and magnitude of the voltage of the event. For example, only a portion of the VSD material may pulse, depending on voltage and power levels of the electrical event.

Accordingly, FIG. 1 illustrates that the electrical characteristics of the VSD composition, such as conductivity or trigger voltage, is affected in part by (i) the concentration of particles, such as conductive particles, semiconductive particles, or other particles (e.g. core shell particles); (ii) electrical and physical characteristics of the particles, including resistive characteristics (which are affected by the type of particles, such as whether the particles are core shelled or conductors); and (iii) electrical characteristics of the binder 105 (including electron mobility of the polymer material used for the binder).

Specific compositions and techniques by which organic and/or HAR particles are incorporated into the composition of VSD material is described in U.S. patent application Ser. No. 11/829,946, entitled VOLTAGE SWITCHABLE DIELECTRIC MATERIAL HAVING CONDUCTIVE OR SEMI-CONDUCTIVE ORGANIC MATERIAL; and U.S. patent application Ser. No. 11/829,948, entitled VOLTAGE SWITCHABLE DIELECTRIC MATERIAL HAVING HIGH ASPECT RATIO PARTICLES; both of the aforementioned patent applications are incorporated by reference in their respective entirety by this application.

Additionally, an embodiment provides for VSD material that includes varistor particles as a portion of its particle constituents. Thus, an embodiment incorporates a concentration of particles that individually exhibit non-linear resistive properties, so as to be considered active varistor particles. Such particles typically comprise zinc oxide, titanium dioxide, Bismuth oxide, Indium oxide, in oxide, nickel oxide, copper oxide, silver oxide, praseodymium oxide, Tungsten oxide, and/or antimony oxide. Such a concentration of varistor particles may be formed from sintering the varistor particles (e.g. zinc oxide) and then mixing the sintered particles into the VSD composition. In some applications, the varistor particle compounds are formed from a combination of major components and minor components, where the major components are zinc oxide or titanium dioxide, and the minor components or other metal oxides (such as listed above) that melt of diffuse to the grain boundary of the major component through a process such as sintering.

Particles with high bandgap (e.g. using insulative shell layer(s)) can also be used. Accordingly, in some embodiments, the total particle concentration of the VSD material, with the inclusion of a concentration of core shell particles (such as described herein), is sufficient in quantity so that the particle concentration exceeds the percolation threshold of the composition.

Under some conventional approaches, the composition of VSD material has included metal or conductive particles that are dispersed in the binder of the VSD material. The metal particles range in size and quantity, depending in some cases on desired electrical characteristics for the VSD material. In particular, metal particles may be selected to have characteristics that affect a particular electrical characteristic. For example, to obtain lower clamp value (e.g. an amount of applied voltage required to enable VSD material to be conductive), the composition of VSD material may include a relatively higher volume fraction of metal particles. As a result, it becomes difficult to maintain a low initial leakage current (or high resistance) at low biases due to the formation of conductive paths (shorting) by the metal particles. As described below, the polymer material may be selected and/or doped to facilitate reduction in clamp/trigger voltage with minimal negative impact to desired off-state electrical characteristics of the VSD material.

Figure 2:
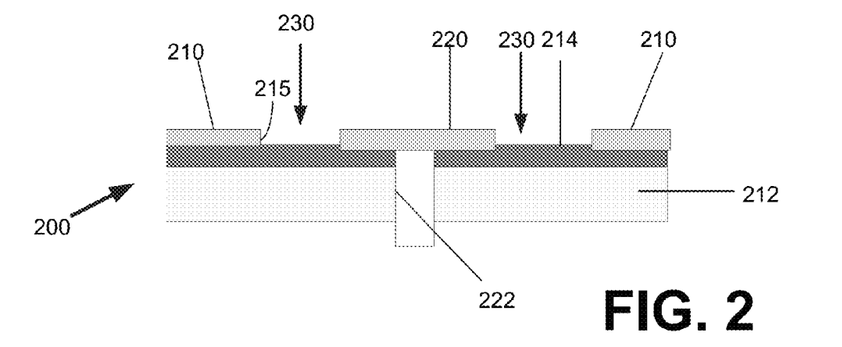
FIG. 2 is an illustrative sectional view of an electrical substrate device (e.g. printed circuit board or section thereof) having a gap structure that geometrically configures or aligns protective material, under an embodiment.

FIG. 2 is an illustrative sectional view of an electrical substrate device (e.g. printed circuit board or section thereof) having a gap structure that geometrically configures or aligns protective material, under an embodiment. The device 200 may include conductive elements 210, 220 provided on a substrate 212. Protective material 214 underlies the electrical elements. Various circuit configurations incorporate protective material 214 with the conductive elements 210, 220. A gap 215 separates the conductive elements 210, 220. Collectively, the conductive elements 210, 220 and gap 215 form a gap structure 230. According to some embodiments, the conductive elements 210, 220 correspond to a pad and antipad. A via 222 may extend one of the contacts 210, 220 to ground. When a transient electrical event occurs, at least a portion of the protective material formed in the gap structure switches into a conductive state. When in the conductive state, the VSD material connects the conductive element 210, 220 to ground 120.

Figures 3, 4, 5:
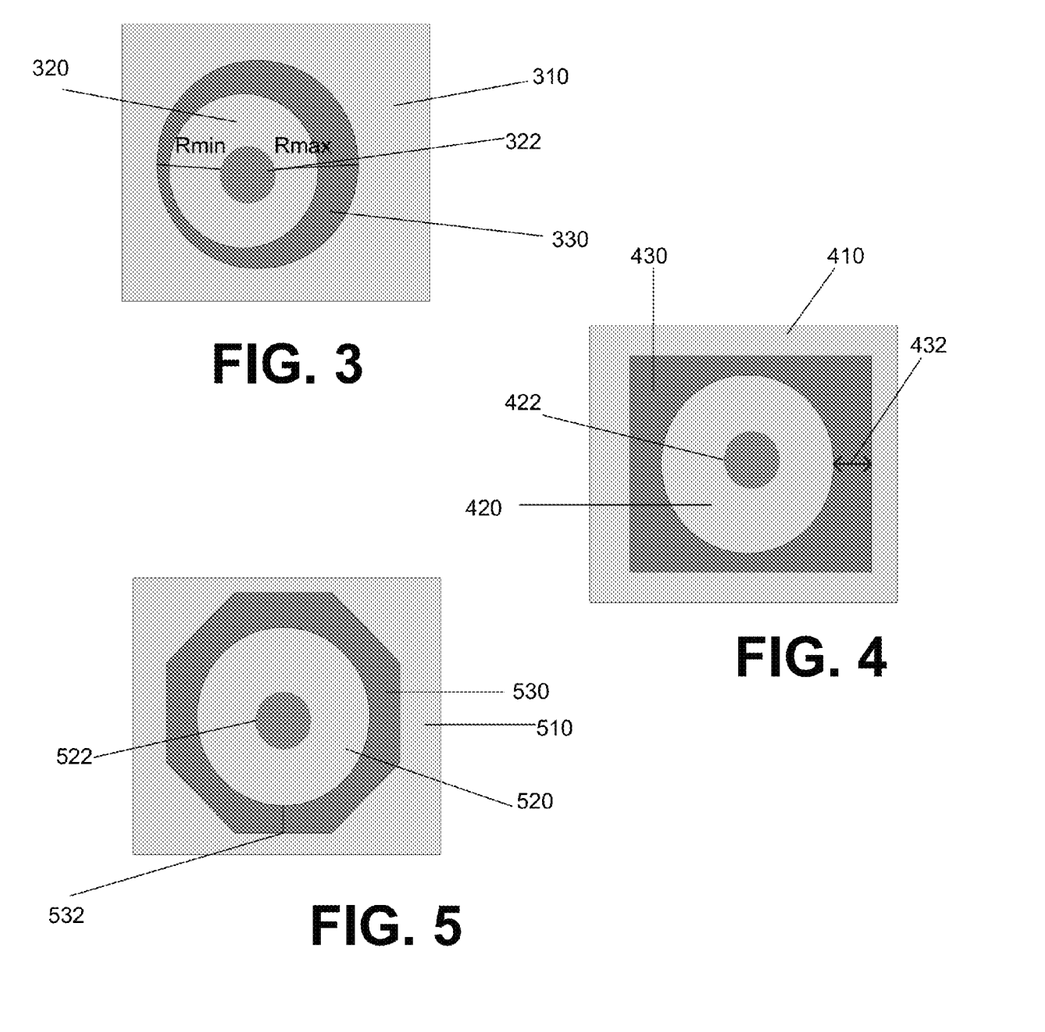
FIG. 3 is an illustrative top view of a gap structure comprising concentric and offset electrodes, according to an embodiment.
FIG. 4 illustrates an alternative gap structure, according to another embodiment.
FIG. 5 illustrates still another gap structure in which multiple critical paths can be formed, according to another embodiment.

As described with FIG. 3 through FIG. 5 and elsewhere, embodiments provide that the gap structure 230 can be geometrically configured or aligned to space the electrodes (conductive elements 110, 120) unevenly from one another across the layer of protective material. When the electrodes are spaced unevenly from one another, the critical path is the shortest distance between the two electrodes. The portion of the protective material that underlies or forms the critical path is the most likely portion of the protective material to switch on (i.e. become conductive) or switch on first when a low energy switching event occurs (e.g. event that switches only a portion of the protective material switches). As a consequence of using protective material at the critical path, (i) even low energy events create high current density across the reduced dimension, and (ii) the use of protective material for the critical path significantly reduces the defect density of the layer as a whole. Defects can cause undesirably high pre-leakage, by forming a portion of the gap as a critical path, these defects can be reduced or eliminated.

As an additional consideration, some embodiments provide that the dimension of the critical path may be set to be less than the expected size of the defect in the protective material. More specifically, VSD material can be assumed to incorporate random defects in composition.

Depending on various factors (e.g. composition methodology), the defects can be assumed to occur at a particular density that can be expressed as follows:

D(number of defects)/S(span of VSD material).

When high quality VSD compositions are used in the context of gap formations between electrodes, D can be assumed as less than 1, so that 1 defect can be assumed for given S unit of distance (spanning between electrodes). If the dimension of the critical path is less than or even about the same as S, the VSD material that comprises the critical path likely contains no defects. Thus, the portion of the VSD material that is most likely to switch on in the event of a transient electrical event is likely to be defect-free.

A structure such as described by embodiments herein may be situated or used to protect against electrical events, such as ESD, EOS or even lightning strike.

FIG. 3 is an illustrative top view of a gap structure comprising concentric and offset electrodes, according to an embodiment. In FIG. 3, the first electrode 310 and second electrode 320 (which may coincide with electrodes 210, 220 of FIG. 2) are separated by VSD material 330 (as the protective material 214). The second electrode 320 and VSD material 330 are each circular, and the VSD material 330 connects to the second electrode 320 and the first electrode 310. The second electrode 320 extends to ground through via 322. In an embodiment the second electrode 320 is aligned or positioned to be offset with respect to the VSD material 330 and first electrode 310. The critical path coincides with the shortest radius R1. The portion of VSD material 330 that underlies or forms R1 is likely to switch when a low energy event with sufficient trigger voltage occurs. As mentioned, the VSD material of the critical path provides high current density and is set to be less in size than an unacceptable defect dimension. Non-critical paths may or may not turn on depending on the transient voltage or current.

FIG. 4 illustrates an alternative gap structure, according to another embodiment. In FIG. 4, the first electrode 410 and second electrode 420 (which may coincide with electrodes 210, 220 of FIG. 2) are separated by VSD material 430 (as the protective material 214). The second electrode 420 is depicted as circular, and the VSD material 430 circumvents the second electrode 420, but has a polygonal shape (e.g. square). The second electrode 420 may extend to ground through via 422. The separation of the first electrode 410 and second electrode 420 may vary across the VSD material 430. The shortest separation distance 432 between the two electrodes forms the critical path. More than one critical path may be formed.

FIG. 5 illustrates still another gap structure in which multiple critical paths can be formed, according to another embodiment. In FIG. 5, the first electrode 510 and second electrode 520 (which may coincide with electrodes 210, 220 of FIG. 2) are separated by VSD material 530 (as the protective material 214). The second electrode 520 is depicted as circular, and the VSD material 530 circumvents the second electrode 520, but has a polygonal shape (e.g. octagonal). The second electrode 520 may extend to ground through via 522. The separation of the first electrode 510 and second electrode 520 may vary across the VSD material 530. The shortest separation distance 532 may form the critical path. More than one critical path can be formed, particularly if the first electrode 510 is not offset relative to the second electrode. In the example shown, the outer electrode is an octagon, and the separation distance to the second electrode 520 is minimal at the midpoint on each side of the octagon. Thus, eight separate regions may be provided that are minimal or coincide to provide a critical path. The particular critical path(s) that are switched on may be determined by location and direction of the transient electrical pulse.

In addition to offsets, the two-dimensional geometric configuration of the VSD material (or other protective material) relative to the first or second electrode may vary from those shown, to encompass, for example, alternative polygonal shapes. Likewise, the second electrode (which is surrounded and separated from the first electrode by VSD material) may have alternative configurations, such as, for example, a triangular configuration (see FIG. 6, critical path shown by R) or square/rectangular configuration (see FIG. 7).

Figure 6:
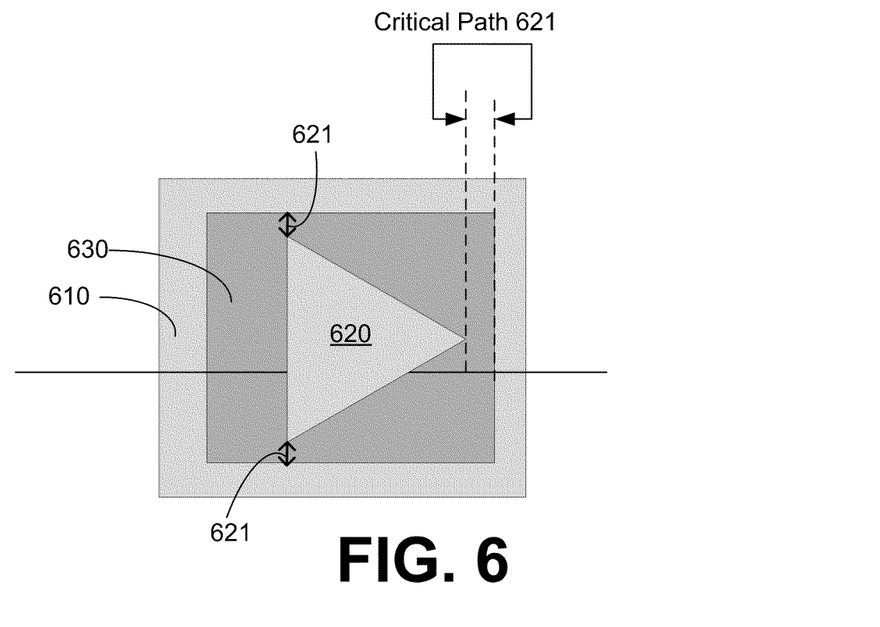

More specifically, FIG. 6 illustrates an alternative triangular geometric configuration in which a gap structure formed between two electrodes has multiple critical paths from which the protective layer can be switched on. In the example shown, the inner second electrode 620 is triangular and contained within a square or rectangular electrode 610. A layer of VSD material 630 separates the electrodes 610, 620. As a result of the triangular shape, three critical paths 621 are formed with the underlying VSD material 630 to switch on in the presence of a transient electrical event.

Figure 7:
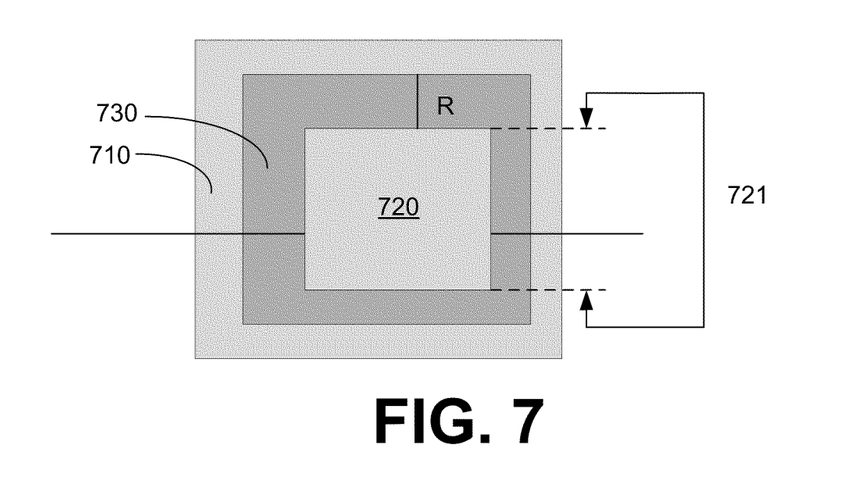
FIG. 7 illustrates an alternative rectangular geometric configuration in which a gap structure formed between two electrodes has a critical strip or area, under another embodiment.

FIG. 7 illustrates an alternative rectangular geometric configuration in which a gap structure formed between two electrodes has a critical strip or area, of which at least a portion can switch on with the occurrence of a transient electrical event. More specifically, in the example shown, the inner second electrode 720 is square rectangular and positioned within another square or rectangular electrode 710. The inner electrode 720 is also offset within the outer electrode 710. As a result of the offset, the gap structure between the inner and outer electrode is separated by a strip 721 that defines the minimum separation distance between the electrodes 710, 720. The strip 721 provides an area or region of VSD material that at least partially switches on in the event of a transient event. It is believed that the particular geometry promotes or enhances switching to occur in VSD material that is contained in the region of the strip 721, particularly in response to transient electrical events which are borderline in satisfying the threshold for switching the composition of VSD material on.

Embodiments such as described herein may be incorporated into various structures. In one embodiment, the uneven or asymmetrical arrangement for spacing a pair of electrodes over an underlying layer of VSD material may be embedded or integrated into a discrete surge protector, printed circuit board, or semiconductor package. In some embodiments, the structure may correspond to a lightning rod.

Embodiments include individual elements and concepts described herein, independently of other concepts, ideas or systems, as well as combinations of elements recited anywhere in this application. Although illustrative embodiments of the invention have been described in detail with reference to the accompanying drawings, it is to be understood that the described embodiments are not limited to those precise embodiments, but rather include modifications and variations as provided. Furthermore, a particular feature described either individually or as part of an embodiment can be combined with other individually described features, or parts of other embodiments, even if the other features and embodiments make no mention of the particular feature.

What is claimed is:

1. An electrical device comprising: a first electrode;
a second electrode separated from the first electrode to form a gap structure;
a layer of protective material that spans the gap structure to contact the first electrode and the second electrode;
wherein the layer of protective material is (i) a dielectric in absence of a voltage that exceeds a characteristic voltage level, and (ii) a conductor with application of a voltage that exceeds a characteristic voltage level of the composition;
wherein a dimension of the gap structure, corresponding to a separation distance between the first electrode and the second electrode, is varied and includes a minimum separation distance that coincides with a critical path of the layer of protective material between the first electrode and the second electrode;
wherein the first electrode surrounds all of the second electrode, and wherein a center of the second electrode is offset relative to a center of the first electrode so as to vary the separation distance with the first electrode at different locations along the perimeter of the second electrode; and
wherein the protective material is a varistor.

2. The electrical device of claim 1, wherein one of the first or second electrodes is interconnected to a grounding element so that the first and second electrode are both electrically grounded when the layer of protective material switches from the non-conductive state.

3. The electrical device of claim 1, wherein the minimum separation distance between the first electrode and the second electrode is greater than a defect density length of the protective material.

4. The electrical device of claim 1, wherein the protective material is voltage switchable dielectric (VSD) material.

5. The electrical device of claim 1, wherein each of the second electrode and the protective material is circular or elliptical in shape, and wherein the protective material surrounds the second electrode and is geometrically offset with respect to the second electrode.

6. The electrical device of claim 1, wherein each of the first electrode and the protective material is polygonal, and the second electrode is circular or elliptical.

7. The electrical device of claim 1, wherein the first electrode is polygonal, and each of the protective material and the second electrode is circular or elliptical.

8. The electrical device of claim 1, wherein the second electrode is polygonal.

9. The electrical device of claim 1, wherein the protective material is circular or elliptical in surrounding the second electrode.

10. The electrical device of claim 1, wherein the first electrode, second electrode and protective material are arranged so that a resulting electric field from the electrical event is optimized to be non-uniform.

11. The electrical device in claim 1, wherein the electrical device is a discrete surge protector.

12. The electrical device in claim 1, wherein the electrical device is a printed circuit board or discrete semiconductor package.

13. The electrical device of claim 1, wherein the protective material protects against lightning strike.

14. The electrical device of claim 1, wherein the protective material protects against an electrostatic discharge event.

15. The electrical device of claim 7, wherein the first electrode has a triangular shape.

16. The electrical device of claim 1 wherein the dimension of the critical path is less than or equal to the span at which at least one defect in the protective material is expected.

* * * * *